(12) United States Patent
Yoshida

(10) Patent No.: US 6,445,001 B2
(45) Date of Patent: *Sep. 3, 2002

(54) SEMICONDUCTOR DEVICE WITH FLIP-CHIP STRUCTURE AND METHOD OF MANUFACTURING THE SAME

(75) Inventor: Akito Yoshida, Kanagawa-ken (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/870,654

(22) Filed: Jun. 6, 1997

(30) Foreign Application Priority Data

Jun. 12, 1996 (JP) ............................... 8-171664

(51) Int. Cl.[7] ........................... H01L 23/58; H01L 21/66
(52) U.S. Cl. ..................... 257/48; 257/778; 257/786; 438/14; 438/18; 438/612; 438/666; 29/593
(58) Field of Search ..................... 257/48, 786, 781, 257/700, 707, 777, 778; 438/614, 14, 15, 16, 17, 18, 611, 612, 613, 666, FOR 342, 343, 108; 29/593

(56) References Cited

U.S. PATENT DOCUMENTS

| | | | |
|---|---|---|---|
| 4,144,493 A | * 3/1979 | Lee et al. ....................... | 257/48 |
| 4,243,937 A | * 1/1981 | Multani et al. ................ | 257/48 |
| 4,254,445 A | * 3/1981 | Ho ............................... | 257/786 |
| 4,413,271 A | * 11/1983 | Gontowski, Jr. et al. ..... | 257/48 |
| 4,951,098 A | * 8/1990 | Albergo et al. ................ | 257/48 |
| 5,157,476 A | * 10/1992 | Yoshida ......................... | 438/15 |
| 5,249,728 A | * 10/1993 | Lam .............................. | 438/614 |
| 5,367,763 A | 11/1994 | Lam .............................. | 29/827 |
| 5,418,186 A | * 5/1995 | Park et al. .................... | 438/614 |
| 5,466,956 A | * 11/1995 | Aeba ............................. | 257/48 |

(List continued on next page.)

FOREIGN PATENT DOCUMENTS

| | | | |
|---|---|---|---|
| EP | 0660386 | 6/1995 | |
| JP | 52-30381 | * 3/1977 | .................. 257/48 |
| JP | 58-15251 | * 1/1983 | |
| JP | 2-184043 | * 7/1990 | .................. 257/48 |
| JP | 3-82129 | * 4/1991 | .................. 257/48 |

OTHER PUBLICATIONS

"Protecting Si Wafers Against Damage During Testing" IBM Technical Disclosure Bulletin vol. 32, No. 4A, Sep. 1989, p. 121.

"Semiconductor Chip I/O Configuration for Plastic Flat Pack, Tape Automated Bonding, or Solder Ball Joined Flip Chip Packages" IBM Technical Disclosure Bulletin vol. 33, No. 10B, Mar. 1991, pp. 332–33.

*Primary Examiner*—David L. Talbott
*Assistant Examiner*—Alonzo Chambliss
(74) *Attorney, Agent, or Firm*—Finnegan, Henderson, Farabow, Garrett & Dunner, L.L.P.

(57) ABSTRACT

A semiconductor device has a plurality of input/output terminals formed on the inner region on a semiconductor substrate, and a plurality of die testing terminals formed on the peripheral region on the semiconductor substrate, and the input/output terminals and the die testing terminals are connected to each other by a metal wiring layer. Die testing is performed by bringing probes projecting from a probe card into contact with the plurality of die testing terminals.

11 Claims, 7 Drawing Sheets

U.S. PATENT DOCUMENTS

| | | | | |
|---|---|---|---|---|
| 5,475,236 A | * | 12/1995 | Yoshizaki | 257/48 |
| 5,517,127 A | | 5/1996 | Bergeron et al. | 324/760 |
| 5,532,614 A | * | 7/1996 | Chiu | 257/48 |
| 5,633,210 A | * | 5/1997 | Yang et al. | 438/699 |
| 5,646,422 A | * | 7/1997 | Hashizume | 257/48 |
| 5,684,304 A | * | 11/1997 | Smears | 257/48 |
| 5,719,449 A | * | 2/1998 | Strauss | 257/786 |
| 5,838,023 A | * | 11/1998 | Goel et al. | 257/48 |
| 5,891,745 A | * | 4/1999 | Dunaway et al. | 438/18 |
| 5,973,376 A | * | 10/1999 | Rostoker et al. | 257/776 |
| 6,204,074 B1 | * | 3/2002 | Bertolet et al. | 438/18 |
| 6,369,407 B1 | * | 4/2002 | Hikita et al. | 257/48 |

* cited by examiner

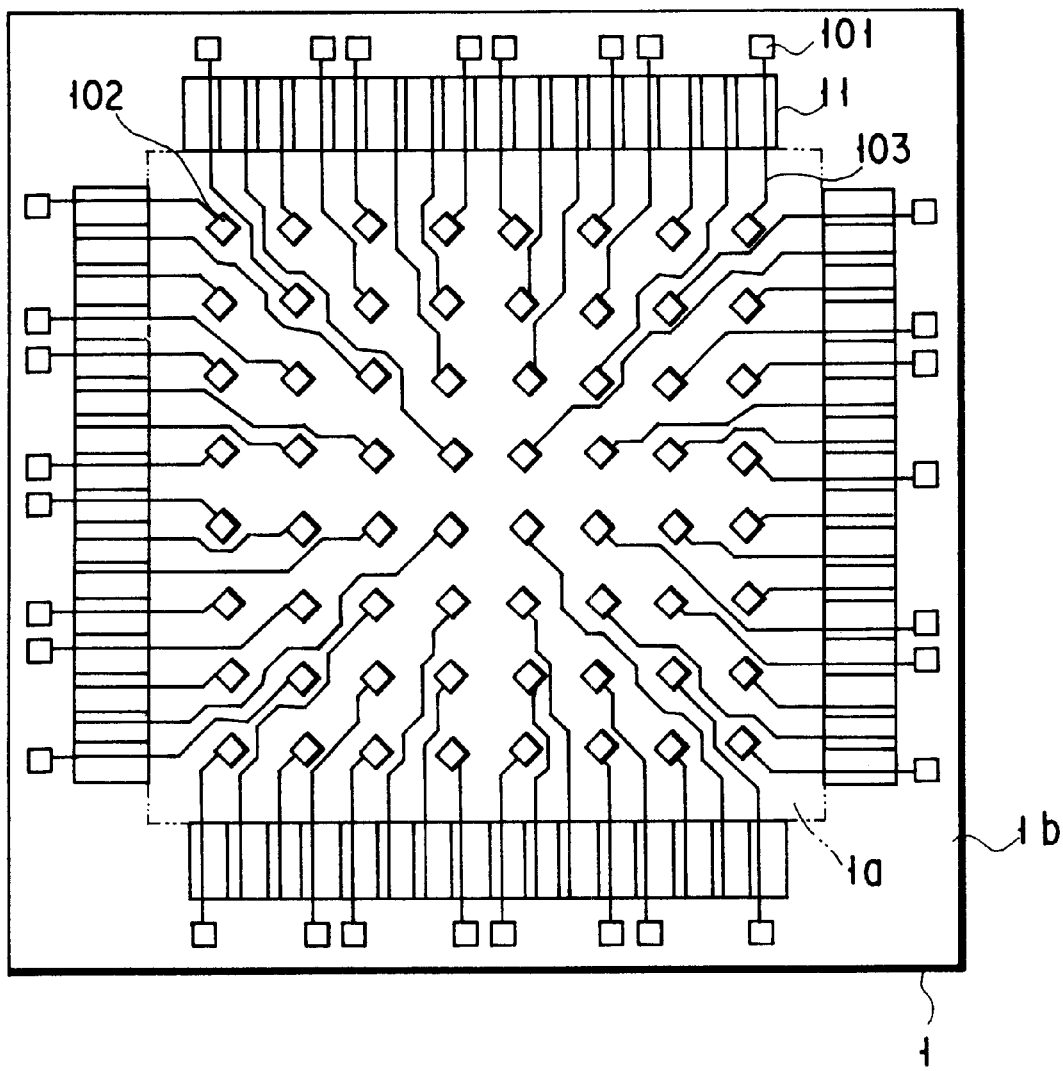
F I G. 18

SEMICONDUCTOR DEVICE WITH FLIP-CHIP STRUCTURE AND METHOD OF MANUFACTURING THE SAME

BACKGROUND OF THE INVENTION

The present invention relates to a semiconductor device with a flip-chip structure, in which semiconductor elements (chips) are connected to a circuit board via protruding electrodes such as solder bumps, and a method of manufacturing the same.

Conventionally, in order to mount semiconductor elements on a circuit board, the following methods are used. That is, the distal ends of a plurality of lead lines extending from each semiconductor element (to be referred to as a chip hereinafter) are electrically connected to a wiring or interconnect pattern on a circuit board, or a chip is mounted on a circuit board and is electrically connected thereto by wire bonding, TAB (Tape Automated Bonding), or the like.

However, in the former method in which lead lines are extended from the chip and are connected to the circuit board, the interval between adjacent bumps is limited, thus posing a serious bottleneck against realization of high packaging density of semiconductor devices.

Especially, in recent years, semiconductor devices are used in a variety of applications, and their packaging densities are increasing. For example, a low-profile circuit board such as a memory card is often used, and the number of memory elements to be mounted is on the rise.

Under such circumstances, packaging chips using lead lines has limitations.

In view of this problem, a flip-chip structure has received a lot of attention. In this structure, bumps are attached to a plurality of connection electrodes (pads) formed on a chip, and are directly connected to the wiring pattern on the circuit board.

FIG. 1 is a sectional view of a conventional semiconductor device in which a chip consisting of a silicon semiconductor is mounted on a circuit board by flip-chip bonding. FIG. 2 is a plan view showing the major surface of a semiconductor substrate, that has bumps, and FIG. 3 is a sectional view showing the structure of input/output terminals having bumps.

A semiconductor substrate 1 comprises pad electrodes 7 and bumps 3. Each pad electrode 7 is used as a pad electrically connected to an internal integrated circuit on the major surface of the semiconductor substrate 1, and consists of, e.g., aluminum.

Each bump 3 is connected on the pad electrode 7, is made up of a low-melting point metal solder bump containing lead (Pb), tin (Sb), and the like as major components, and has a height of about 100 µm.

Each input/output terminal 10 formed on the major surface of the conventional semiconductor substrate 1 shown in FIG. 2 comprises a bump 3 and a pad electrode 7, as shown in FIG. 3 (to be explained later) and a barrier metal 9 is normally interposed between the bump 3 and the pad electrode 7.

At least one chip is mounted on a circuit board 2. A plurality of bumps 3 on the semiconductor substrate 1 are electrically connected to pad electrodes (to be referred to as substrate pads hereinafter) 8 connected to a wiring pattern (not shown) formed on the surface of the circuit board 2, thus mounting the semiconductor substrate 1 on the circuit board 2.

Each bump 3 may use gold in addition to the low-melting point metals, or may also use a structure prepared by forming a conductive layer on the surface of a spherical insulating member. As the low-melting metals, Pb—Sn solder, In—Sn solder, and the like are known.

As the circuit board 2, a printed board prepared by stacking glass base members impregnated with an epoxy resin, a ceramic board, a silicon semiconductor board, and the like are used. Also, an encapsulating resin may be filled between the semiconductor substrate 1 and the circuit board 2.

The major surface of the semiconductor substrate 1 is divided into an inner region 1a and a peripheral region 1b. On the inner region 1a, an integrated circuit 20 as an internal circuit formed inside the semiconductor substrate 1 is formed. An input/output circuit 11 is formed on that region of the peripheral region 1b, which is in the vicinity of the inner region 1a, and the input/output terminals 10 are electrically connected to the integrated circuit 20 via the input/output circuit 11.

The bump structure on the semiconductor substrate is as shown in FIG. 3. That is, a pad 7 of, e.g., aluminum, which is electrically connected to the integrated circuit formed inside the semiconductor substrate, is formed on an insulating film 4 formed on the surface of the semiconductor substrate 1. The surrounding portion of the pad 7 is protected by an insulating film 5 of, e.g., $SiO_2$.

An opening portion or via hole 5a of the insulating film 5 is formed on the surface of the pad 7 to expose the pad 7 therefrom. This opening portion 5a is covered by a barrier metal 9, which is electrically connected to the pad 7. A bump 3 is attached on the barrier metal 9. The barrier metal 9 consists of, e.g., Pd/Ni/Ti, TiW, Ti/Ti/W, or the like.

As described above, the input/output terminals of the conventional semiconductor device with the TAB or flip-chip structure are formed on the peripheral region along the outer edge of the semiconductor substrate.

Defect discrimination of an integrated circuit in the chip or wafer state (to be referred to as die testing hereinafter) is done by electrical tests by bringing probes 6 projecting from a probe card 12 into contact with the bumps 3 on the input/output terminals 10, as shown in FIG. 4.

However, in recent years, semiconductor devices having the same functions as those of conventional ones can be realized in smaller sizes along with advance of the micro-patterning techniques of elements, while it has become harder to decrease the pitch of input/output terminals due to limitations traced to the interconnection techniques.

As a consequence, the number of input/output terminals formed on the outer peripheral portion of the semiconductor substrate is insufficient, and a structure in which a plurality of input/output terminals are arranged on the entire major surface of the semiconductor substrate 1 is proposed, as shown in FIG. 5. The input/output terminals of a chip are arranged on the inner region where the integrated circuit is formed, and the peripheral region of the major surface of the semiconductor substrate 1.

However, the chip with such structure suffers the following problem.

That is, die testing is conducted using the probes projecting from the conventional probe card, but the probes cannot be simultaneously in contact with all the plurality of input/output terminals on the entire major surface.

In order to solve this problem, a probe card that can set a plurality of probes on the entire major surface of the semiconductor substrate is required. When a probe card with such structure is used, it is very hard to attain alignment between a plurality of bumps on the input/output terminals of the semiconductor substrate and the plurality of probes, thus posing another problem.

BRIEF SUMMARY OF THE INVENTION

The present invention has been made in consideration of the above situation, and has as its object to provide a semiconductor device which comprises die testing terminals and input/output terminals with a structure that allow easy die testing even by a conventional probe card using probes, and a method of manufacturing the same.

In order to achieve the above object, a semiconductor device according to the present invention comprises:

a semiconductor substrate;

an input/output terminal portion formed on the semiconductor substrate, the input/output terminal portion having a plurality of input/output terminals formed on an inner region on the semiconductor substrate, and a plurality of die testing terminals formed on a peripheral region on the semiconductor substrate; and a metal wiring layer for connecting the input/output terminals and the die testing terminals.

Also, a method of manufacturing a semiconductor device according to the present invention, comprises the steps of:

forming a multilayered wiring structure on a semiconductor substrate;

forming a plurality of pads by patterning an uppermost metal wiring layer of the multilayered wiring structure by lithography and etching;

coating the uppermost metal wiring layer with a protection insulating film while leaving opening portions from which surfaces of the pads are exposed;

forming a conductive anti-etching protection film on the exposed pads by lithography and etching;

forming a barrier metal formation metal film on the protection insulating film including the anti-etching protection film;

forming bumps on the pads on an inner region on the semiconductor substrate via the anti-etching protection film and the barrier metal formation metal film;

forming input/output terminals on the inner region on the semiconductor substrate by forming barrier metals between the bumps and the anti-etching protection film by patterning the barrier metal formation metal film; and forming die testing terminals by removing the barrier metal formation metal film after the step of forming the barrier metal formation metal film on the pads on an external region on the semiconductor substrate and the anti-etching protection film.

Furthermore, a method of manufacturing a semiconductor device according to the present invention, comprises the steps of:

forming a multilayered wiring structure on a semiconductor substrate;

forming a conductive anti-etching protection film on an uppermost metal layer of the multilayered wiring structure;

forming a plurality of pads coated with the anti-etching protection film by simultaneously patterning the metal wiring layer and the anti-etching protection film by lithography and etching;

coating the uppermost metal wiring layer with a protection insulating film while leaving opening portions from which the anti-etching protection film portions on the pads are exposed;

forming a barrier metal formation metal film on the protection insulating film including the anti-etching protection film;

forming bumps on the pads on an inner region on the semiconductor substrate via the anti-etching protection film and the barrier metal formation metal film;

forming input/output terminals on the inner region on the semiconductor substrate by forming barrier metals between the bumps and the anti-etching protection film by patterning the barrier metal formation metal film; and forming die testing terminals by removing the barrier metal formation metal film after the step of forming the barrier metal formation metal film on the pads on an external region on the semiconductor substrate and the anti-etching protection film.

With this arrangement, according to the semiconductor device and its manufacturing method of the present invention, easy die testing can be attained even using a conventional probe card.

On the semiconductor substrate, both the die testing terminals having no bumps and the connection input/output terminals formed with bumps are present. Since the input/output terminal portion is made up of wiring lines consisting of, e.g., aluminum, and bumps formed thereon, the barrier metal for preventing metals from diffusing is interposed between the bump and the aluminum wiring line.

The anti-etching protection film protects aluminum wiring lines of the die testing terminal portion from dissolving upon removal of the barrier metal by etching. Also, the anti-etching protection film protects metal wiring lines from mechanical damage upon die testing.

The above-mentioned problem upon alignment between the plurality of bumps on the input/output terminals of the semiconductor substrate and the plurality of probes can be solved.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 18 is a plan view of a semiconductor device according to the fourth embodiment of the present invention.

DETAILED DESCRIPTION OF THE INVENTION

Figure 1:
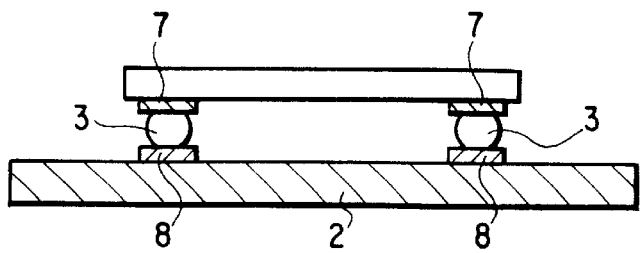
FIG. 1 is a sectional view showing the structure of a conventional semiconductor device mounted on a circuit board.
Figure 3:
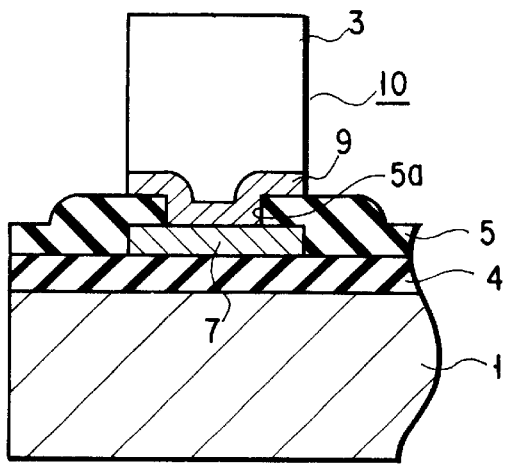
FIG. 3 is a sectional view of the input/output terminals of the conventional semiconductor device.
Figure 2:
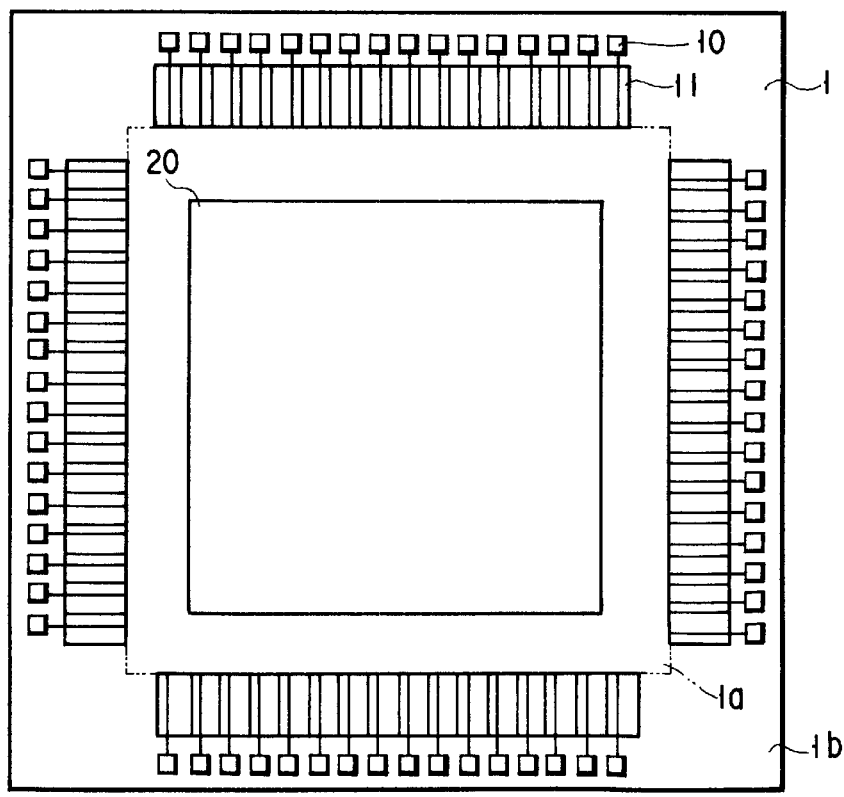
FIG. 2 is a plan view of the conventional semiconductor device mounted on the circuit board.
Figure 4:
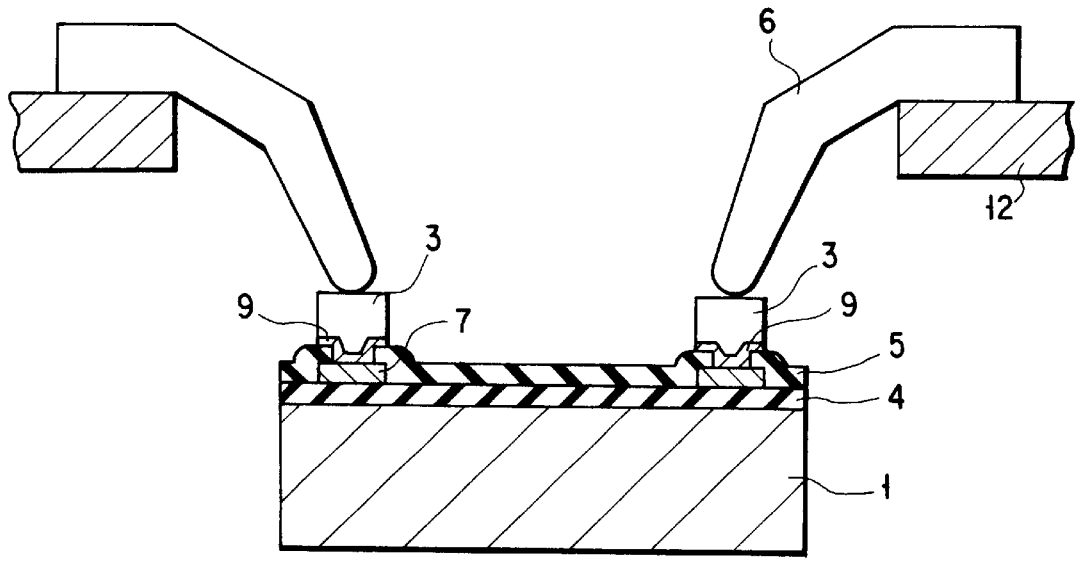
FIG. 4 is a sectional view showing the manner die testing is conducted for the input/output terminals of the conventional semiconductor device.
Figure 5:
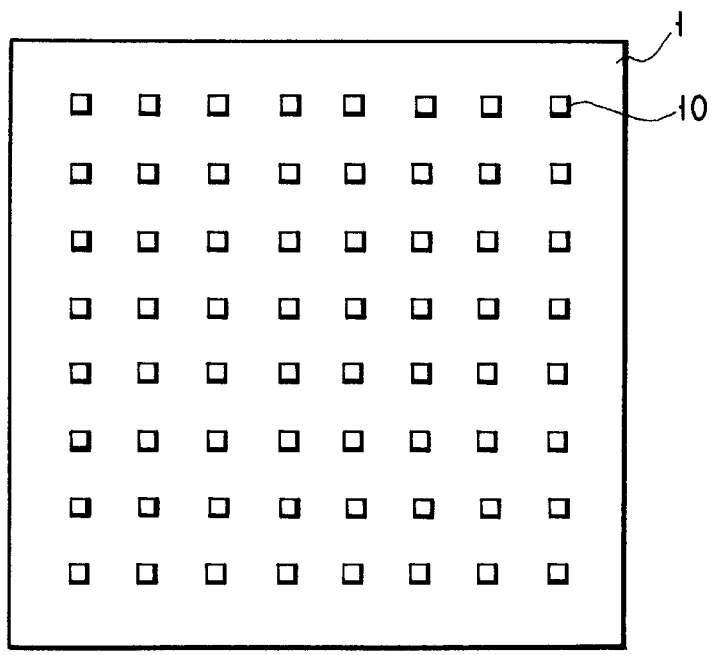
FIG. 5 is a plan view of a semiconductor substrate with a plurality of input/output terminals of a conventional semiconductor device.
Figure 6:
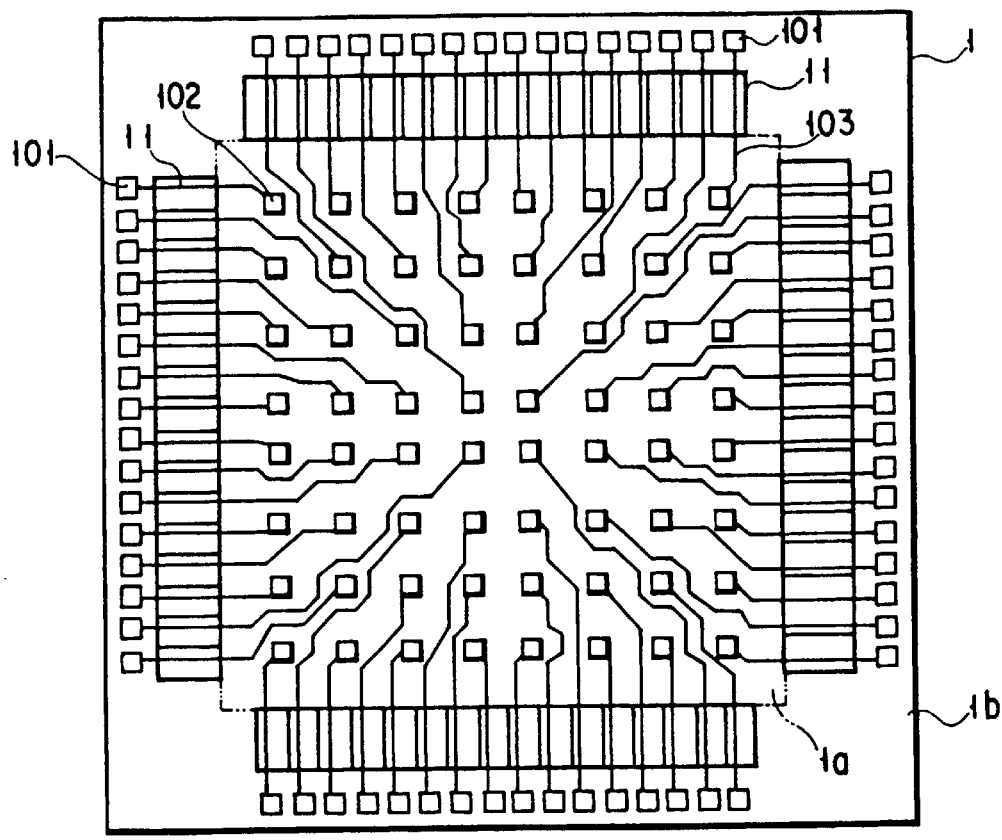
FIG. 6 is a plan view of a semiconductor device according to the first embodiment of the present invention.
Figure 7:
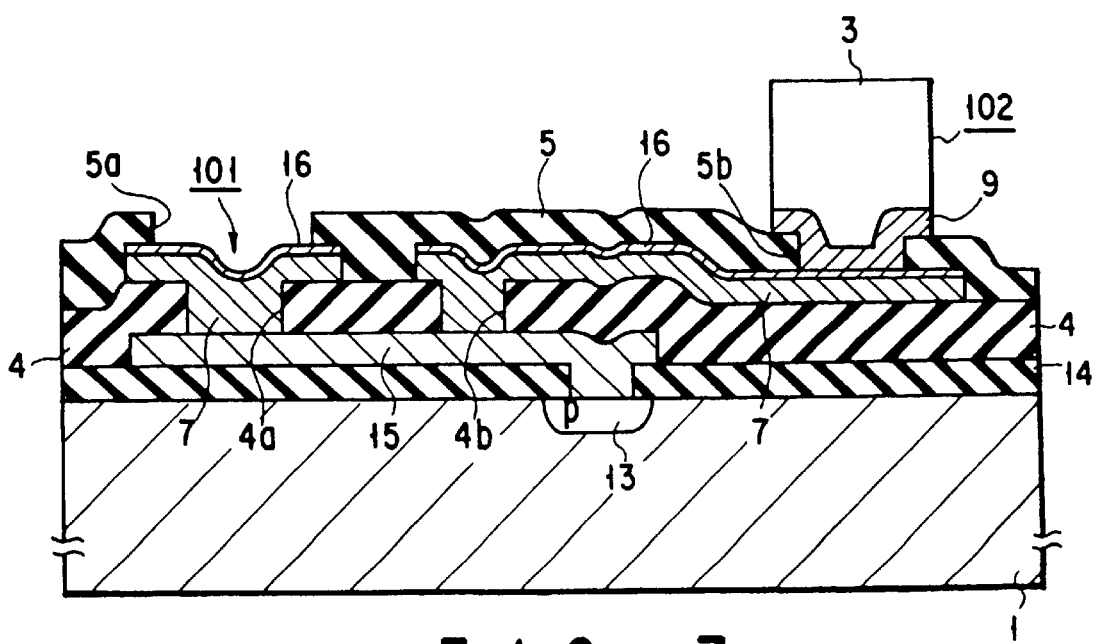
FIG. 7 is a sectional view showing the structure of die testing terminals and input/output terminals of the input/output terminal portion of the semiconductor device shown in FIG. 6.

FIG. 6 is a plan view of a semiconductor device according to the first embodiment of the present invention, and FIG. 7 shows the sectional structure of die testing terminals 101 and input/output terminals 102 of the semiconductor device shown in FIG. 6.

The major surface of a semiconductor substrate 1 is divided into an inner region 1a which includes an integrated circuit, and is formed with the input/output terminals 102, and a peripheral region 1b formed with input/output circuits 11 and the die testing terminals 101.

The input/output circuits 11 are arranged between the die testing terminals 101 and the input/output terminals 102.

The die testing terminals 101 and the input/output terminals 102 consist of a plurality of metal wiring lines, and are electrically connected to each other via a connection wiring layer below these metal wiring lines.

Bumps 3 have a thickness of 100 $\mu$m, and are made up of low-melting point solder containing lead, tin, and the like.

FIG. 7 is a sectional view of the semiconductor substrate showing the internal structure of the input/output terminals 102. The major surface of, e.g., an n-type silicon semiconductor substrate 1 is coated with an insulating film 14 such as a thermal oxide film.

For example, a second aluminum wiring layer 15 is formed on the insulating film 14. The aluminum wiring layer 15 is electrically connected to, e.g., a p-type impurity doped region 13 formed in an element region of the surface region of the semiconductor substrate 1 via an opening portion or window formed in the insulating film 14.

The second aluminum wiring layer 15 is coated with an insulating interlayer 4 of, e.g., CVD $SiO_2$. A third aluminum wiring layer that serves as pads 7 is formed on the insulating interlayer 4. A conductive anti-etching protection film 16 is formed on the entire surface of the third aluminum wiring layer. The pads 7 of both the die testing terminals 101 and input/output terminals 102 are electrically connected to the second aluminum wiring layer 15 via opening portions 4a and 4b formed in the insulating interlayer 4.

Accordingly, the die testing terminals 101 and the input/output terminals 102 are electrically connected to each other. The pads 7 made up of the third aluminum wiring layer are coated with an $SiO_2$ protection insulating film 5 via the anti-etching protection film 16.

Opening portions 5a and 5b are formed in the protection insulating film 5 in correspondence with the die testing terminals 101 and input/output terminals 102. In each die testing terminal 101, the anti-etching protection film 16 is exposed. In each input/output terminal 102, a barrier metal 9 is formed on the anti-etching protection film 16, and a bump 3 is formed on the barrier metal 9.

As described above, no bump is attached to the die testing terminal 101, and a bump is attached to the input/output terminal 102.

In this manner, the die testing terminals 101 having no bumps for tests, and the input/output terminals 102 formed with bumps for connection are present on the semiconductor substrate, and they constitute a single input/output terminal portion.

Since each input/output terminal 102 is made up of a wiring line of, e.g., aluminum, and the bump 3 formed thereon, the barrier metal 9 for preventing metals from diffusing is interposed between the bump and the aluminum wiring line.

On the other hand, each die testing terminal 101 consists of an aluminum wiring line alone, and the barrier metal 9 formed on the entire major surface of the semiconductor substrate must be removed by a barrier metal etching solution. Therefore, the anti-etching protection film 16 protects the aluminum wiring lines of the die testing terminals 101 from dissolving upon removal of the barrier metal by etching.

Also, the anti-etching protection film 16 protects the aluminum wiring lines from mechanical damage upon die testing.

Since the die testing terminals 101 are arranged on the peripheral region of the semiconductor substrate 1, a conventional probe card can be effectively used upon die testing.

An embodiment of a method of manufacturing a semiconductor device according to the present invention will be explained below with reference to FIGS. 8 to 12.

Figure 8:
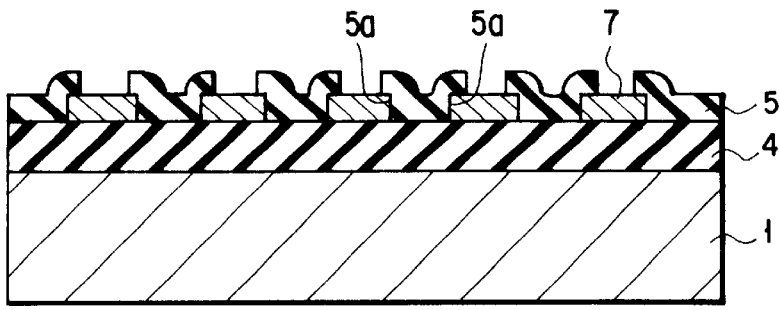
FIG. 8 is a sectional view showing one manufacturing process of the semiconductor device shown in FIG. 6.

FIG. 8 does not illustrate metal wiring lines (second aluminum wiring layer) for electrically connecting the die testing terminals 101 and the input/output terminals 102 for the sake of simplicity.

An aluminum metal film having a thickness of about 500 nm formed on an insulating film 4 of, e.g., $SiO_2$ that covers a semiconductor substrate 1 is patterned to form, e.g., a third aluminum wiring layer.

Predetermined portions of this aluminum wiring layer are used as pads 7 having a nearly square shape.

The insulating film 4 and the third aluminum wiring layer serving as the pads 7 are coated with a protection insulating film 5 of, e.g., $SiO_2$. The protection insulating film 5 is patterned to form opening portions 5a from which the pads 7 are exposed.

Figure 9:
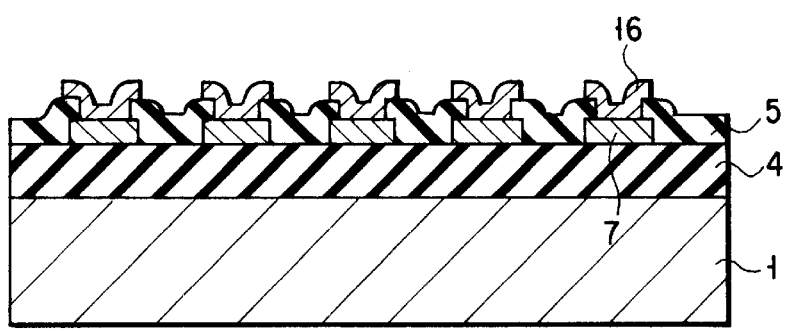
FIG. 9 is a sectional view showing one manufacturing process of the semiconductor device that follows FIG. 8.

Subsequently, as shown in FIG. 9, an anti-etching protection film 16 is formed on the exposed pads 17. The anti-etching protection film 16 consists of, e.g., titanium nitride (TiN), and has a thickness of about 50 nm.

The thickness of the anti-etching protection film 16 must be larger than 30 nm, and is effective within the range from about 30 nm to 50 nm in terms of mechanical strength. The anti-etching protection film may properly use other nitrides such as TiSiN and the like in addition to TiN.

Figure 10:
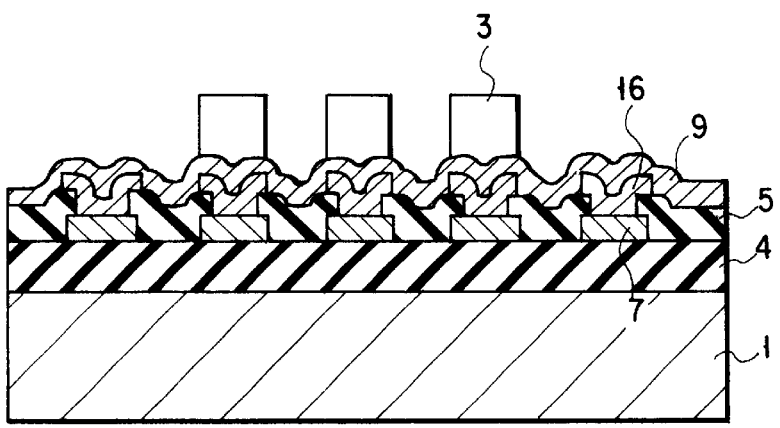
FIG. 10 is a sectional view showing one manufacturing process of the semiconductor device that follows FIG. 9.

As shown in FIG. 10, a barrier metal formation metal film 9 is formed on the insulating film 5 including the anti-etching protection film 16. As the input/output terminals 102 formed on the inner region of the semiconductor substrate 1, bumps 3 are formed on the pads 7 via the anti-etching protection film 16 and the barrier metal formation metal film 9.

Figure 11:
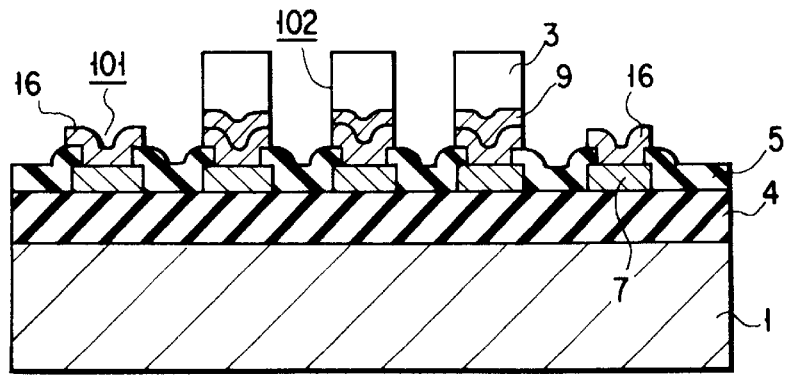
FIG. 11 is a sectional view showing one manufacturing process of the semiconductor device that follows FIG. 10.

Subsequently, as shown in FIG. 11, the barrier metal formation metal film is patterned to form a barrier metal 9 between the bump 3 and the anti-etching protection film 16 of each input/output terminal 102. On the other hand, the barrier metal formation metal film on the die testing terminals 101 is removed. In this manner, the die testing terminals 101 having no bumps are formed on a peripheral region 1b of the semiconductor substrate 1, and the input/output terminals 102 with the bumps 3 are formed on an inner region 1a of the substrate 1.

The barrier metal formation metal film consists of, e.g., Ti/TiW; the thickness of Ti is 100 nm, and the thickness of TiW, 500 nm. A barrier metal etching solution (etchant) used for patterning this metal film includes, e.g., a mixed acid of HCl—HNO$_3$—CH$_3$COOH, diluted HF, and the like. As the barrier metal, Pd/Ni/Ti, TiW, and the like may be used in addition to the above-mentioned material. The anti-etching protection film made up of a metal nitride film such as TiN, TiSiN, or the like has a high resistance against such barrier metal etching solutions. If the barrier metal consists of Pd/Ni/Ti, it is etched by a mixed acid of HCl—HNO$_3$—CH$_3$COOH, Ti by diluted HF, and TiW by diluted HF.

Since each Die testing terminal 101 is made up of an aluminum wiring layer alone that serves as the pad 7 and is coated with the anti-etching protection film 16, and has no bump, the barrier metal formation metal film formed on the entire major surface of the semiconductor substrate is removed by the barrier metal etching solution. In this case, the anti-etching protection film 16 protects the aluminum wiring layer of the die testing terminals 101 from dissolving upon removal of the barrier metal 9 by etching.

A method of manufacturing a semiconductor device according to the second embodiment of the present invention will be described below with reference to FIGS. 12 to 15.

Figure 12:
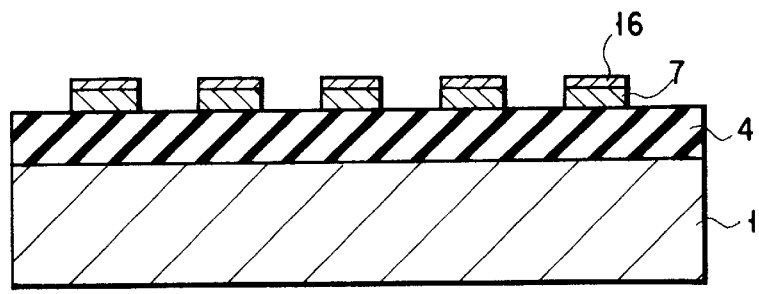
FIG. 12 is a sectional view showing one manufacturing process of a semiconductor device according to the second embodiment of the present invention.

FIG. 12 does not illustrate metal wiring lines (second aluminum wiring layer) for electrically connecting the die testing terminals 101 and the input/output terminals 102 for the sake of simplicity.

An aluminum metal film having a thickness of about 800 nm and a TiN film formed on an insulating film 4 of, e.g., SiO$_2$ that covers a semiconductor substrate 1 are patterned to form, e.g., a third aluminum wiring layer coated with an anti-etching protection film 16 having a thickness of about 100 nm.

Predetermined portions of this aluminum wiring layer are used as pads 7 each having a nearly square shape.

Figure 13:
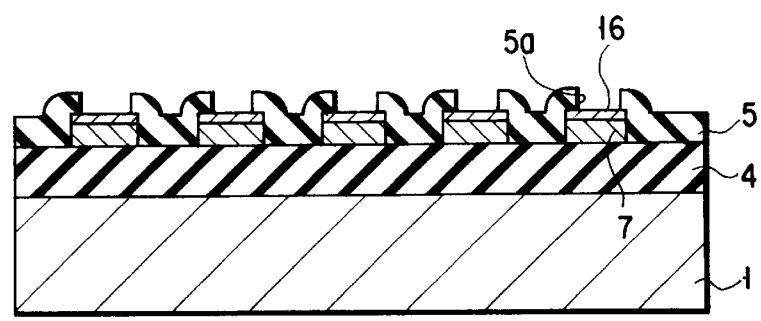
FIG. 13 is a sectional view showing one manufacturing process of the semiconductor device that follows FIG. 12.

Subsequently, as shown in FIG. 13, the insulating film 4 and the third aluminum wiring layer thereon are coated with a protection insulating film 5 of, e.g., SiO$_2$. The insulating film 5 is patterned to form opening portions 5a from which the anti-etching protection film portions 16 on the pads 7 are exposed.

Figure 14:
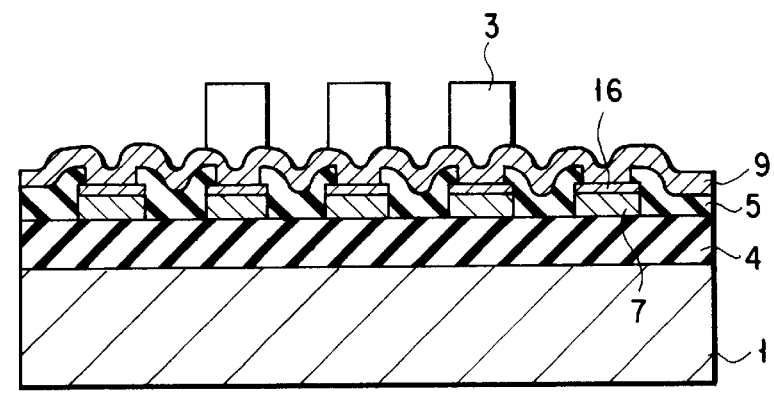
FIG. 14 is a sectional view showing one manufacturing process of the semiconductor device that follows FIG. 13.
Figure 15:
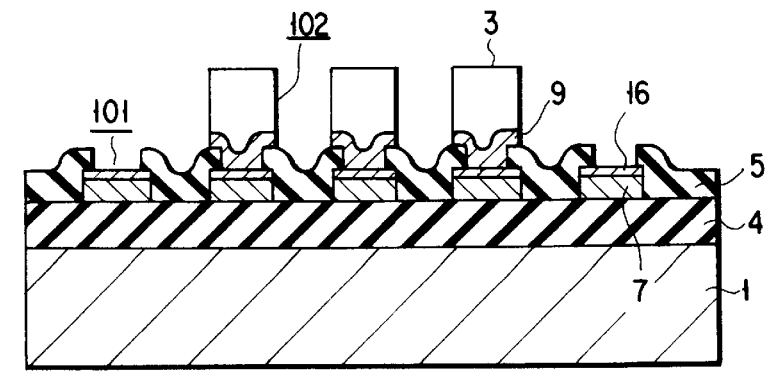
FIG. 15 is a sectional view showing one manufacturing process of the semiconductor device that follows FIG. 14.

As shown in FIG. 14, a barrier metal formation metal film serving as a barrier metal 9 is formed on the anti-etching protection film 16 and the insulating film 5. On the pad 7 of each input/output terminal 102 formed on the inner region 1a of the semiconductor substrate 1, a bump 3 is formed via the anti-etching protection film 16 and the barrier metal formation metal film.

The barrier metal formation metal film is patterned to form a barrier metal 9 between the bump 3 of each input/output terminal 102 and the anti-etching protection film 16, and the barrier metal formation metal film on the die testing terminals 101 is removed.

In this manner, the die testing terminals 101 having no bumps are formed on a peripheral region 1b of the semiconductor substrate 1, and the input/output terminals 102 with the bumps 3 are formed on an inner region 1a of the substrate 1.

The barrier metal formation metal film consists of, e.g., Ti/TiW; the thickness of Ti is 100 nm and the thickness of TiW, 500 nm. As a barrier metal etching solution (etchant) used for patterning this metal film, diluted HF is used.

Since each Die testing terminal 101 is made up of an aluminum wiring layer alone which is coated with the anti-etching protection film 16, and has no bump, the barrier metal formation metal film formed on the entire major surface of the semiconductor substrate must be removed by the barrier metal etching solution.

The anti-etching protection film 16 protects the aluminum wiring layer of the die testing terminals 101 from dissolving upon removal of the barrier metal 9 by etching.

Figure 16:
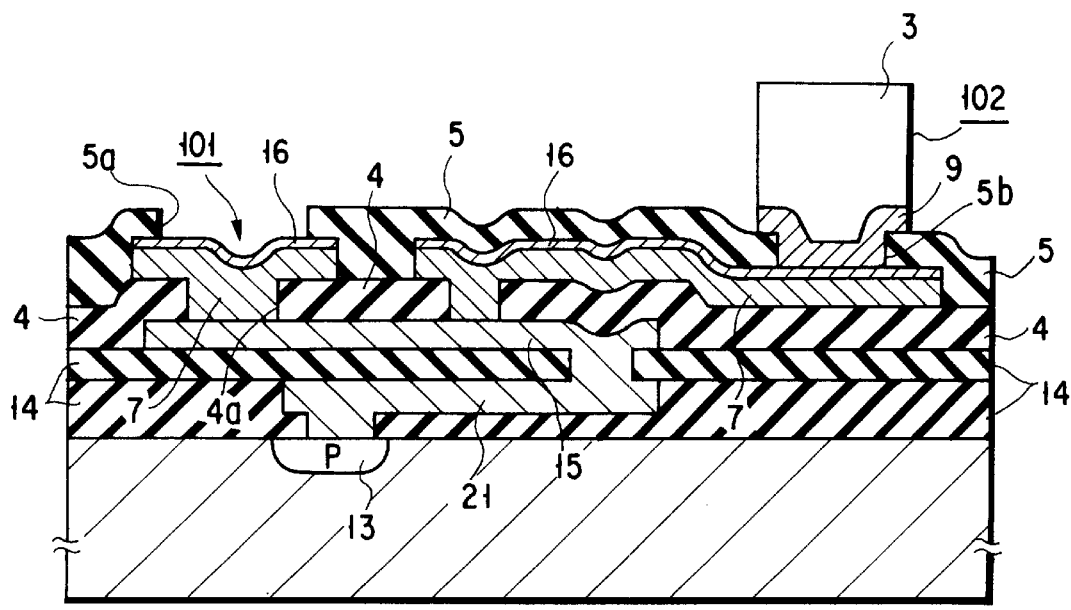
FIG. 16 is a sectional view showing the structure of die testing terminals and input/output terminals of the input/output terminal portion of a semiconductor device according to still another embodiment of the present invention having a multilayered wiring structure.

The above-mentioned arrangement of the semiconductor device according to the first embodiment of the present invention shown in FIG. 7 uses the first aluminum wiring layer 15 on the substrate 1 as a first metal wiring layer, and the third aluminum wiring layer serving as the pads 7 as a second metal wiring layer. However, the present invention is not limited to this. For example, in another multilevel interconnect architecture, as shown in FIG. 16, an aluminum wiring layer 21 to be connected to a p-type impurity doped region 13 formed in an element region of the surface region of the substrate 1, may be additionally formed and may be used as a third metal wiring layer.

The third embodiment of the present invention will be described below with reference to FIG. 17.

Figure 17:
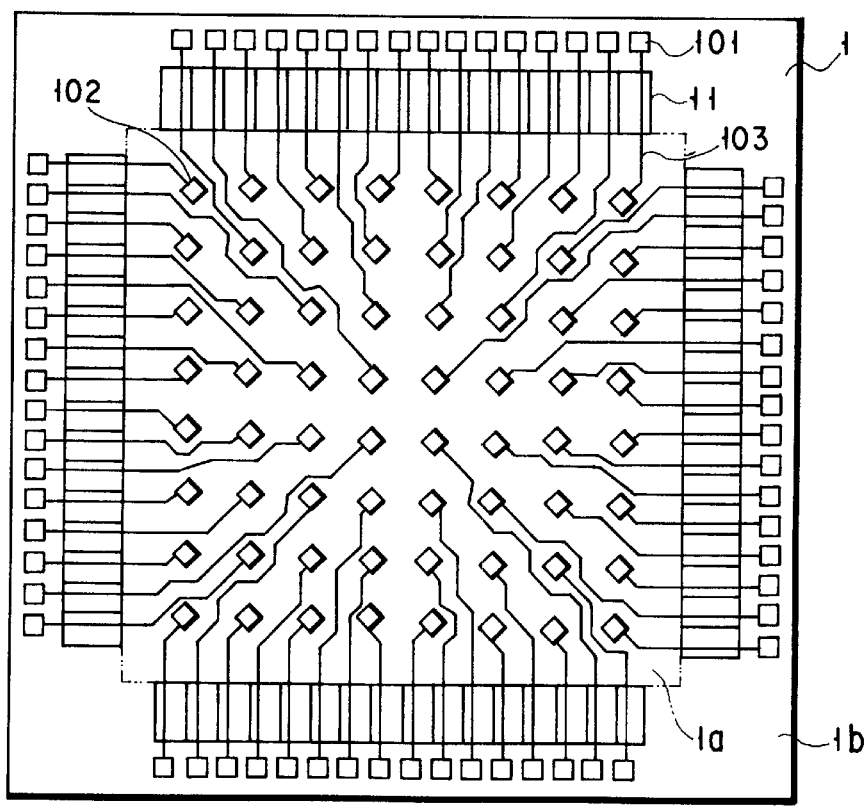
FIG. 17 is a plan view of a semiconductor device according to the third embodiment of the present invention.

FIG. 17 is a plan view showing the arrangement in which a plurality of input/output terminals 102 are arranged on the major surface of a semiconductor substrate 1 formed with a semiconductor device.

Die testing terminals 101 and input/output circuits 11 are formed on the semiconductor substrate 1. The major surface of the semiconductor substrate 1 is divided into an inner region 1a formed with an integrated circuit, and a peripheral region 1b formed with the input/output circuits 11.

The input/output circuits 11 are arranged between the die testing terminals 101 and input/output terminals 102. An input/output terminal portion includes the die testing terminals 101 for testing, which are formed on the peripheral region 1b and have no bumps, and the input/output terminals 102 for connection, which are formed on the inner region 1a and have bumps. The die testing terminals 101 and the input/output terminals 102 are electrically connected to each other by a metal wiring layer 103 below the metal wiring layers that make up these terminals.

The semiconductor substrate 1 has a substantially square shape. Also, the shape of each input/output terminal 102 is square.

In the first embodiment shown in FIG. 6, the input/output terminals 102 are arranged so that their arbitrary sides extend parallel to the sides of the semiconductor substrate 1. However, in the embodiment shown in FIG. 17, the input/output terminals 102 are arranged so that a central line parallel to two opposing sides of each input/output terminal 102 extends parallel to one diagonal line of the semiconductor substrate 1.

When the input/output terminals 102 are arranged in this manner, wiring of a connection means that connects the die testing terminals 101 and the input/output terminals 102 can be easily attained.

The fourth embodiment of the present invention will be explained below with reference to FIG. 18.

FIG. 18 is a plan view showing the structure of input/output terminals on the major surface of a semiconductor substrate formed with a semiconductor device.

The major surface of a semiconductor substrate 1 is divided into an inner region 1a which is formed with an integrated circuit and a plurality of input/output terminals 102 are arranged, and a peripheral region 1b which is formed with input/output circuits 11 and die testing terminals 101.

The input/output circuits 11 are arranged between the die testing terminals 101 and the input/output terminals 102.

An input/output terminal portion includes the die testing terminals 101 for testing, which are formed on the peripheral region 1b and have no bumps, and the input/output terminals 102 for connection, which are formed on the inner region 1a and have bumps.

The die testing terminals 101 and the input/output terminals 102 are electrically connected to each other by a metal wiring layer 103 below the metal wiring layers that make up these terminals.

The semiconductor substrate 1 has a substantially square shape. Also, the shape of each input/output terminal 102 is square. In this embodiment, the input/output terminals 102 are arranged so that a central line parallel to two opposing sides of each input/output terminal 102 extends parallel to one diagonal line of the semiconductor substrate 1. With this arrangement, wiring of a connection means that connects the die testing terminals 101 and the input/output terminals 102 can be easily attained.

This embodiment exemplifies a case wherein some of the die testing terminals 101 on the peripheral region 1b to be connected in correspondence with the connection input/output terminals 102 which are arranged on the inner region 1a and are formed with bumps are omitted.

This semiconductor substrate 1 incorporates a scan circuit, and specific die testing terminals 101 alone need only be subjected to die testing using a shift register. For this reason, probes need not be brought into contact with all the die testing terminals.

With the above-mentioned arrangement, die testing can be easily performed even using a conventional probe card.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A semiconductor device comprising:

a semiconductor substrate;

an input/output terminal array formed on said semiconductor substrate in a two-dimensional array fashion, said input/output terminal array having a plurality of input/output terminals evenly formed on an inner region on said semiconductor substrate;

a peripheral region formed on said semiconductor substrate, said peripheral region having a plurality of testing terminals equal in number to the number of the input/output terminals;

a first metal wiring layer for connecting each of said input/output terminals to a dedicated one of said testing terminals located from said input/output terminal; and input/output circuits arranged along sides of said semiconductor substrate on the peripheral region of said semiconductor substrate, said plurality of testing terminals being respectively arranged between said input/output circuits and the sides of said semiconductor substrate;

wherein said testing terminals and said input/output terminals are formed of a second metal wiring layer, said input/output terminals are arranged at a place inner to that of said input/output circuits on the semiconductor substrate, and each of said plurality of input/output terminals includes a barrier layer formed over said second metal wiring layer to have a top surface higher than that of each testing terminal, and a bump formed on said barrier layer.

2. The semiconductor device according to claim 1, wherein the dedicated one of said testing terminals to which each of the plurality of said input/output terminals is connected is a nearest one of said testing terminals.

3. A semiconductor device comprising:

a semiconductor substrate;

an input/output terminal array formed on said semiconductor substrate in a two-dimensional array fashion, said input/output terminal array having a plurality of input/output terminals evenly formed on an inner region on said semiconductor substrate;

a peripheral region formed on said semiconductor substrate, said peripheral region having a plurality of testing terminals equal in number to the number of the input/output terminals; and a first metal wiring layer for connecting each of said input/output terminals to a dedicated on of said testing terminals located remote from said input/output terminal; and wherein each of said testing terminals and each of said plurality of input/output terminals are formed of a second metal wiring layer, each of said plurality of input/output terminals has a substantially square distal end, a central line parallel to two opposing sides of the distal end is inclined at about 45° with respect to an arbitrary side of said semiconductor substrate; and each of said plurality on input/output terminals includes a barrier layer formed over said second metal wiring layer to have a top surface higher than that of each testing terminal, and a bump formed on said barrier layer.

4. The semiconductor device according to claim 3, wherein the dedicated one of said testing terminals to which each of the plurality of said input/output terminals is connected is a nearest one of said testing terminals.

5. A semiconductor device comprising:

a semiconductor substrate;

an input/output terminal array formed on said semiconductor substrate in a two-dimensional array fashion, said input/output terminal array having a plurality of input/output terminals evenly formed on an inner region on said semiconductor substrate;

a peripheral region formed on said semiconductor substrate, said peripheral region having a plurality of testing terminals equal in number to the number of the input/output terminals;

wherein a multilayered wiring structure is formed on said semiconductor substrate;

wherein said input/output terminals each are constituted by an insulating film, a second metal wiring layer formed on said insulating film, a barrier metal formed on said second metal wiring layer via a conductive anti-etching protection film, and a bump formed on said second metal wiring layer, wherein said barrier metal has a top surface higher than that of each testing terminal;

wherein each of said testing terminals is constituted by said insulating film and said second wiring layer formed on said insulating film; and wherein each bump of said input/output terminals is connected to one of said testing terminals via said first wiring layer, said conductive anti-etching protection film and said second wiring layer.

6. The semiconductor device according to claim 3, wherein the dedicated one of said testing terminals to which each of the plurality of said input/output terminals is connected is a nearest one of said testing terminals.

7. A semiconductor device comprising:

a semiconductor substrate;

an input/output terminal array formed on said semiconductor substrate in a two-dimensional array fashion, said input/output terminal array having a plurality of input/output terminals evenly formed on an inner region on said semiconductor substrate;

a peripheral region formed on said semiconductor substrate, said peripheral region having a plurality of testing terminals equal in a number of the input/output terminals; and a first metal wiring layer for connecting each of said input/output terminals to a dedicated one of said testing terminals located remote from said input/output terminals;

wherein said testing terminals and said input/output terminals are formed of a second metal wiring layer connected to said first metal wiring layer, said testing terminals are coated with a conductive anti-etching protection film, and each of said plurality of input/output terminals includes a barrier layer formed over said second metal wiring layer to have a top surface higher than that of each testing terminal, and a bump formed on said barrier layer.

8. The semiconductor device according to claim 7, wherein the dedicated one of said testing terminals to which each of the plurality of said input/output terminals is connected is a nearest one of said testing terminals.

9. A semiconductor device comprising:

a semiconductor substrate;

an input/output terminal array formed on said semiconductor substrate in a two-dimensional array fashion, said input/output terminal array having a plurality of input/output terminals evenly formed on an inner region on said semiconductor substrate;

a peripheral region formed on said semiconductor substrate; said peripheral region having a plurality of testing terminals equal in number to the number of the input/output terminals; and a first metal wiring layer for connecting each of said input/output terminals to a dedicated one of said testing terminals located remote from said input/output terminals;

wherein each of said testing terminals and said input/output terminals are formed of an uppermost metal wiring layer of a multilayered wiring structure connected to said first metal wiring layer on said semiconductor substrate, a conductive anti-etching protection film that covers said uppermost metal wiring layer, a barrier metal formed on said anti-etching protection film, and a bump formed on said barrier metal, wherein said barrier metal has a top surface higher than that of each testing terminal.

10. A device according to claim 9, wherein said anti-etching protection film has an anti-etching property higher than said barrier metal with respect to an etchant that etches said barrier metal.

11. The semiconductor device according to claim 9, wherein the dedicated one of said testing terminals to which each of the plurality of said input/output terminals is connected is a nearest one of said testing terminals.

* * * * *

UNITED STATES PATENT AND TRADEMARK OFFICE
CERTIFICATE OF CORRECTION

PATENT NO. : 6,445,001 B2
DATED : September 3, 2002
INVENTOR(S) : Yoshida

It is certified that error appears in the above-identified patent and that said Letters Patent is hereby corrected as shown below:

Column 10,
Line 49, "to a dedicated on" should read -- to a dedicated one --.
Line 59, "plurality on" should read -- plurality of --.

Column 11,
Line 30, "claim 3," should read -- claim 5, --.
Line 44, "equal in a number of" should read -- equal in number to the number of --.

Column 12,
Lines 22-23, "substrate;" should read -- substrate, --.

Signed and Sealed this

Twenty-seventh Day of May, 2003

JAMES E. ROGAN
*Director of the United States Patent and Trademark Office*